United States Patent [19]

Westermeir et al.

[11] Patent Number: 4,555,745
[45] Date of Patent: Nov. 26, 1985

[54] THICK-FILM CAPACITOR MANUFACTURED BY PRINTED-CIRCUIT TECHNIQUES

[75] Inventors: Gisela Westermeir, Hohenroth; Friedhard Fehr, Lauter, both of Fed. Rep. of Germany

[73] Assignee: Preh Elektrofeinmechanische Werke Jakob Preh Nachf. GmbH & Co., Bad Neustadt, Fed. Rep. of Germany

[21] Appl. No.: 425,519

[22] Filed: Sep. 28, 1982

[30] Foreign Application Priority Data

Nov. 5, 1981 [DE] Fed. Rep. of Germany ....... 3143995

[51] Int. Cl.⁴ .......................... H01G 4/20; B05D 5/12
[52] U.S. Cl. ........................................ 361/320; 427/98
[58] Field of Search ...................... 361/320, 397, 402; 427/96, 98

[56] References Cited

U.S. PATENT DOCUMENTS

| | | | |
|---|---|---|---|
| 2,934,479 | 4/1960 | Deer | 361/397 X |
| 3,310,432 | 3/1967 | Griest et al. | 427/98 X |
| 3,481,777 | 12/1969 | Spannhake | 427/98 X |
| 3,996,502 | 12/1976 | Bratschun | 361/321 |
| 4,182,781 | 1/1980 | Hooper et al. | 427/98 X |
| 4,327,126 | 4/1982 | Ogden | 427/98 X |

FOREIGN PATENT DOCUMENTS

| | | |
|---|---|---|
| 2130065 | 3/1972 | Fed. Rep. of Germany . |
| 2744206 | 4/1978 | Fed. Rep. of Germany . |
| 2132935 | 7/1978 | Fed. Rep. of Germany . |
| 2841742 | 4/1980 | Fed. Rep. of Germany . |
| 3143995 | 5/1983 | Fed. Rep. of Germany . |
| 114315 | 7/1975 | German Democratic Rep. . |
| 584672 | 1/1947 | United Kingdom . |

OTHER PUBLICATIONS

"Gedruckte Kondensatoren in Dickschichttechnik", Feinwerktechnik und Messtechnik, 1975, vol. 83, Book 4, pp. 173–178.
"Dickschichtnetzwerke mit gedruckten Kondensatoren", Stemag-Nachrichten, vol. 44, Apr. 1971, pp. 1261–1266.

*Primary Examiner*—Donald A. Griffin
*Attorney, Agent, or Firm*—Woodcock Washburn Kurtz Mackiewicz & Norris

[57] ABSTRACT

A thick-film capacitor and a printed circuit are described, this capacitor being designed for implementation by printed-circuit technology, while the printed circuit contains capacitors of this type, together with the associated conducting paths.

The capacitor dielectric comprises a screen-printable dispersion of dielectric filler substances in a polymeric material which can be cured at comparatively low temperatures, especially a polymeric resin from the group comprising polyurethane resins, polyester resins, epoxy resins and melamine formaldehyde resins. The use of a dielectric of this type enables lower curing temperatures to be used, in the region of approximately 200° C., in contrast to conventional designs of thick-film capacitors with a dielectric containing a glass or ceramic frit, which require firing temperatures of the order of 1,000° C.

The production of the lower and upper electrodes of the capacitors is preferably carried out in combination with the production of the associated conducting paths of the printed circuit. The electrodes of the capacitors and the conducting paths associated therewith, are preferably obtained by a deposition process, from a chemical bath, this process involving no electric current. Deposition is carried out onto an activated base layer producing completely solderable electrodes and conducting paths, of copper or nickel, which adhere strongly to the substrate layers.

A description is also given of a printed circuit, of the above type, with capacitors arranged in a matrix, and with associated connecting leads, this printed circuit being designed as a capacitive input keyboard for data-processing systems.

16 Claims, 7 Drawing Figures

THICK-FILM CAPACITOR MANUFACTURED BY PRINTED-CIRCUIT TECHNIQUES

FIELD OF THE INVENTION

The invention relates to thick-film capacitors, implemented by printed-circuit technology; more particularly, the invention relates to capacitors made integrally with printed circuits containing the terminal leads and connecting leads of the capacitors, as well as to processes for manufacturing these devices.

BACKGROUND OF THE INVENTION

There has long been a need for capacitors which can be manufactured in a simple and inexpensive manner, especially for incorporation into printed circuits. More recently, an increasing need has arisen in this regard, resulting from the use of capacitive input keyboards for data-processing systems. German Offenlegungsschrift No. 2,744,206 relates to a capacitive key, which is intended to be used for a key field of this type, but the capacitor, as such, is assembled in a conventional manner from mechanical parts must be made capable of being moved with respect to one another.

The manufacture of capacitors, involving the application, to a greater or lesser extent, of printed-circuit techniques is already known. A capacitive network is known from German Offenlegungsschrift No. 2,841,742, especially for use as a capacitor-cascade arrangement in voltage-multipliers, in which network metal layers which serve as capacitor foils and terminals are printed on a base plate, this plate forming the dielectric of the capacitor. By stacking dielectric plates of this type, one upon another, with printed-on metal layers and metallized layers for appropriately interconnecting the individual layers, a stacked arrangement is obtained, containing, for example, parallel-connected or series-connected capacitors. However, this design, which uses pre-existing dielectric plates as the dielectric of the capacitor, is not very suitable for incorporation into printed circuits, in which the overriding aim is to produce all parts having electrical functions by means of layers on a substrate plate, or on a carrier plate. Similar considerations apply in the case of known designs of capacitors in which thin metal plates are used as capacitor foils, a feature which likewise does not lend itself to integration into printed-circuit technology, which essentially employs only printing steps or etching steps.

A capacitor which can be manufactured by the screen printing process is already known from German Offenlegungsschrift No. 2,132,935. This capacitor is manufactured by printing a silver paste, as the base electrode of the capacitor, onto a carrier plate. The paste is baked-on, accompanied by evaporation of the carrier agent. Next a screen-printable dielectric paste is applied as a thick-film dielectric, this paste containing a glass or ceramic frit in an organic carrier agent, for example in a solution of ethyl cellulose in terpineol, which is then fired at temperatures between 800° C. and 1,000° C. A silver paste is then applied to the dielectric, as the counter-electrode of the capacitor. This paste is fired at a temperature below 780° C.

This known design of a thick-film capacitor has the disadvantage that, on account of the high firing temperature, in the region of approximately 1,000° C., it is restricted to refractory carrier materials, such as, for example, $Al_2O_3$. Refractory carrier plates of this type, made, for example, of $Al_2O_3$, cannot be kept perfectly flat when their superficial dimensions are sufficiently large to permit the manufacture of large-area input keyboards with a comparatively large number of capacitors and the terminal and connecting leads associated therewith. Moreover, plates of the required size are prohibitively expensive. Further, the use of capacitor-electrodes, produced by printing-on and baking-of silver pastes, entails the disadvantages that there is a risk of the silver migrating during the firing operations and/or during subsequent service. Finally, metallized layers of this type, derived from silver pastes, cannot be soldered without difficulty.

OBJECTS OF THE INVENTION

The invention is accordingly intended to provide a thick-film capacitor, which is manufactured by printed-circuit techniques, and which does not require high firing temperatures on the order of 1,000° C., and which is suitable for extensive integration into the manufacture of printed circuits. In particular, the invention is intended to make it possible to use capacitors of this type in comparatively large numbers on appropriately large-area carrier plates, as is necessary, for example, for capacitive input keyboards of data-processing systems. It is an object of the invention that the capacitor, or a printed circuit containing a plurality of such capacitors, with associated connecting leads, is capable of manufacture virtually exclusively by means of screen printing coating operations (involving, if appropriate, selective etching processes), and that it should be possible to produce the capacitor foils, and the lead terminations, preferably in the form of metallized layers composed of copper or nickel, which are less expensive and, in addition, are directly solderable.

The invention accordingly relates to a thick-film capacitor, implemented by printed-circuit technology, with a base electrode which is provided on a substrate plate or carrier plate, with a thick-film dielectric, which is applied onto this base electrode, preferably by screen printing, and with a counter-electrode which is provided, on this dielectric, in alignment with the base electrode.

SUMMARY OF THE INVENTION

The objects of the invention are satisfied by provision of a dielectric composed of a screen-printable dispersion of dielectric filler substances in a polymeric material which can be cured at comparatively low temperatures.

The thick-film dielectric can, preferably, be composed of a dispersion containing 70 to 90% by weight of dielectric filler substances and 30 to 10% by weight of polymeric material. The polymeric material may contain one or more polymeric resins from the group comprising the polyurethane resins, the polyester resins, the epoxy resins and the melamine formaldehyde resins, while, the dielectric filler substances may include one or more substances from the group comprising ZnO, $Al_2O_3$, $SrTiO_3$ and $BaTiO_3$, or ceramic substances.

According to the basic concept of the invention, the dielectric of the capacitor is produced from a screen-printable thick-film paste, based on a polymeric material which can be cured at comparatively low temperatures. It is thus possible to dispense with high firing temperatures, of the order of 1,000° C.; the polymeric resins specified for the purposes of the invention can be cured at temperatures above 130° C., preferably in the range between approximately 150 and approximately 230° C.

It then becomes possible to use, as the substrate material, conventional resin-impregnated paper, plastics and sheet materials, of the types which are conventionally used for printed circuits, in contrast to the ceramic substrates, which were necessary for the thick-film capacitors produced with glass and ceramic frits as the dielectric, on the lines of German Offenlegungsschrift No. 2,132,935. As a result, it is also possible to manufacture printed circuits with comparatively large surface areas with capacitors of this type, especially printed circuits which are designed as capacitive keying units for input instruments of data-processing systems. Moreover, the polymeric resins used according to the invention as binders for the thick-film dielectric are cheaper than the binders which are necessary for the known thick-film dielectric containing glass or ceramic frits. Further savings are realized in energy costs through the ability of these resins to cure at temperatures which are lower by an order of magnitude while avoiding the degradation of other circuit components which occurs with firing temperatures of the order of 1,000° C. This also permits integration of capacitors of this type into printed circuits.

The production of the lower electrodes, or base electrodes of the capacitor, and, if appropriate, the conducting paths associated therewith, can be carried out, in ways known to the art, possibly by the subtractive technique, i.e., selective etching of a metal foil laminated to the substrate material, or when appropriate, direct printing-on of conducting pastes, in particular silver or gold pastes, in the desired lay-out. According to a particularly advantageous embodiment of the invention, the capacitor base electrode, or electrodes, and, if appropriate, the associated conducting paths, are metallized layers which are deposited by a process not involving electric current onto screen-printed layers which have been loaded with a catalyst and activated for the metallization process which does not involve electric current. In this way it is possible for the metallized layers to be composed, preferably, of copper or also, if appropriate, of nickel. Such processes for metallization not involving electric current include electroless, chemical or autocatalytical metallization processes, which are well understood in the art. These metallized layers, produced by a deposition process which does not involve electric current, on appropriately activated substrate layers, are completely solderable and can be directly connected to chip components. In addition, the metal layers thus obtained exhibit good adhesion to their substrates and are less expensive than electrodes or leads which are produced by printing-on Pd, Ag or Au cermet pastes.

According to a preferred embodiment, the upper or counter electrodes and the associated conducting paths, are produced in a similar manner, as metallized layers deposited again by a process not involving electric current, on a second dielectric layer, over the first thick-film dielectric. This second layer is loaded with a catalyst and activated for the metallization process. For this purpose, it is possible, according to a preferred embodiment of the invention, to arrange that the second dielectric layer of the same type, be applied to the first dielectric layer, following the curing of this layer during the screen printing process, in accordance with the layout desired for the capacitor counter-electrode(s) and for the associated conducting paths, this second dielectric layer additionally containing a catalyst for activating it for the metallization process which does not involve electric current. The second dielectric layer is afterwards metallized in a bath which functions without electric current, to form the capacitor counter-electrode(s) and the associated conducting paths.

The second dielectric layer is of the same composition, or a similar composition, as the first dielectric layer, and may contain, as the activating catalyst, Pd or a reducible Pd compound for example $PdCl_2$.

The first dielectric layer is preferably printed on over essentially the entire surface area, that is to say, over the regions corresponding to the capacitors, over the conducting paths in the lower conducting path plane, and over the interspaces. It is possible, to use a dielectric paste having a low dielectric constant for the regions which lie outside the regions corresponding to the capacitor, this paste employing, for example, dielectric filler substances from the group comprising $Al_2O_3$ and MgO, or ceramic substances having low dielectric constants.

Similar considerations apply in the case of printing-on the second dielectric layer.

In the case of the embodiment of the invention as a printed circuit, which comprises a plurality of capacitors of this type, and conduction paths including the terminal leads and connecting leads assigned to the capacitors, the printed circuit can possess terminal and connecting leads which are coplanar with the electrodes of the capacitors, so that the capacitors and the conducting paths are produced in a fully integrated single process.

The invention is particularly suitable for use in the case of a printed circuit containing a plurality of capacitors of this type, such as a capacitive keying unit for input instruments of data-processing systems. In such units the capacitors are arranged in the form of a matrix, and the upper or counter-electrodes, are not connected directly to their terminal leads, with which they are coplanar, but can be connected to them, by means of bridging contacts which can be operated by keys. The invention thus makes it possible to manufacture, in a simple and inexpensive manner, a capacitive keyboard having a high operational reliability, since the capacitance values assigned to the individual keys are permanently preset and are switched in or out by operating the keys in question, rather than being generated, or varied in their value.

BRIEF DESCRIPTION OF THE DRAWINGS

In the following text, illustrative embodiments of the invention are described by reference to the drawing, in which FIG. 1, comprising subparts 1a to 1f, shows, in each case in diagrammatic cross-sectional view, a printed circuit according to a preferred embodiment of the invention, this printed circuit being intended, in particular, for configuration as a capacitive keying unit, the individual sub-part illustrating successive progress stages.

Figure 1A:
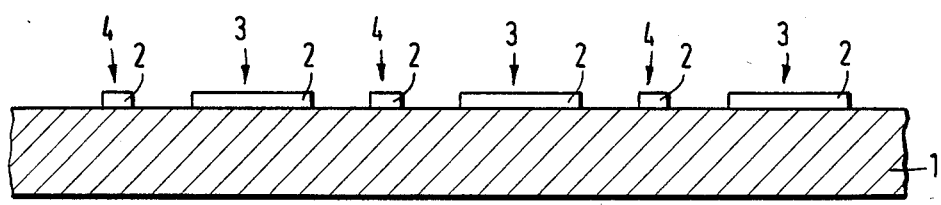

DESCRIPTION OF THE PREFERRED
EMBODIMENT

In the text which follows, the production by printed-circuit techniques of thick-film capacitors according to the invention, with associated conductors, is explained by reference to FIG. 1, the sub-parts of which correspond to different successive process stages. This explanation relates, in particular, to the illustrative case of a matrix arrangement of capacitors for a capacitive keying assembly, such as are used for input devices of data-processing systems.

First of all, the lower capacitor electrodes, or capacitor foils, and the associated connecting and input leads are produced on a substrate plate 1, or substrate 1, which can be composed, for example, of a resin-impregnated paper, the polyphenylene sulphide material sold by the Phillip Chemical Co. of Bartlesville, Okla. under the tradename "Ryton", or of a sheet of polyester of polyimide material. In the illustrative embodiment shown, this operation is carried out by means of a 2-stage process illustrated by FIG. 1a and 1b. In a first process step, according to FIG. 1a, a paste 2, which can be metallized, is printed onto the substrate 1, by the screen printing technique, in accordance with a layout which is desired for the regions 3, associated with the capacitors, and the regions 4, associated with the conducting paths. In a second process step, according to FIG. 1b, the paste 2, is subsequently metallized in a chemical bath which functions without electric current, as indicated in FIG. 1b, at 5. These metallized layers, which are composed, for example, of copper or nickel, and which are capable of being soldered, form, the lower electrodes $C_1$ of the capacitor at 3, and the actual conducting paths, L1, at 4.

Figure 1B:
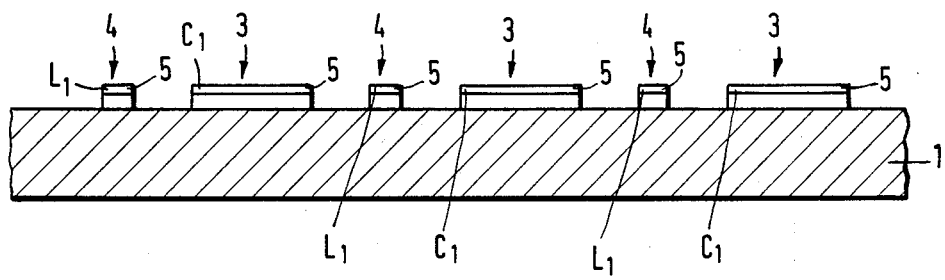

The production of the lower electrodes C1 and of the associated conducting paths L1 could also be effected in a 1-step process, instead of in a 2-step process as illustrated by FIGS. 1a and 1b. In the 1-step process the regions 3 and 4 in FIG. 1 are printed directly with a conducting paste. For this purpose, there would essentially be a choice between nickel pastes or silver pastes, but the latter entails the risk of silver migration during later process steps, as well as during the subsequent operation of the circuit device. Moreover, conductors produced from conducting pastes, in particular from silver pastes, cannot easily be soldered. A further alternative possible method for producing the lower capacitor electrodes $C_1$ and the conducting paths $C_1$ would be to use a subtractive technique, in which the capacitor electrode C1 and the conducting paths L1 would be produced from a metal foil. For example a copper foil, laminated to the carrier-substrate over its entire surface, can be etched to form the electrodes and conducting paths, for example by using photoresist etching-masks, prepared in the desired negative layout by the photo-printing process.

Figure 1C:
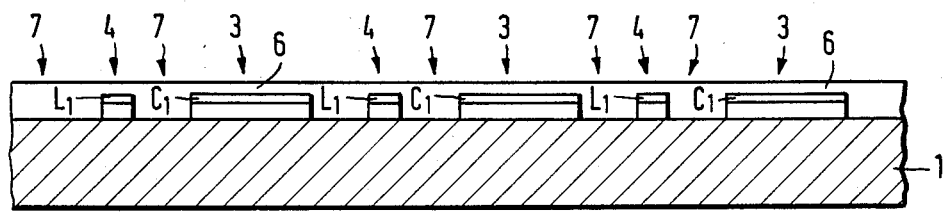
Figure 1D:
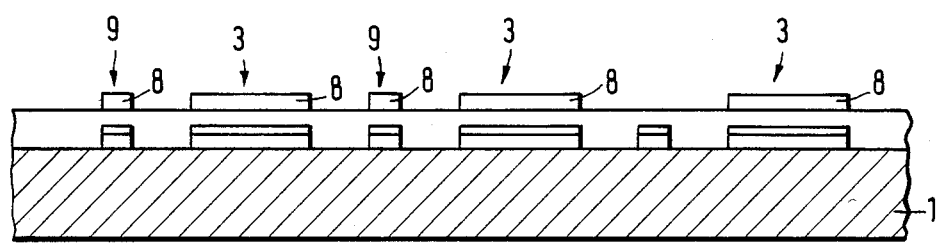

The production of the dielectric layers for the capacitors is now carried out, as the next important step, according to FIG. 1c. In order to do this, the entire circuit is printed with a screen-printable dielectric composition over its entire surface. A screen-printable composition for this purpose should contain a dispersion of dielectric particles, such as, for example, ZnO, $Al_2O_3$, $SrTiO_3$ or $BaTiO_3$, in a curable polymeric material, such as a polyurethane resin, a polyester resin, an epoxy resin or a melamine formaldehyde resin. According to FIG. 1c, both the regions 3, associated with the capacitor, and the regions 4, associated with the conducting paths, as well as the interspaces between these regions, are printed with the dielectric composition 7, which extends over the entire surface area. Alternatively, it is also possible to print, at first, only the regions 3, associated with the capacitor, with the dielectric composition, in a selective manner, while the areas corresponding to the conducting paths, and/or the interstices could be printed, with a different paste, preferably having lower dielectric constants. This would reduce the intrinsic capacitance of the conducting paths to the greatest possible extent, and obtain, as a desired switching characteristic, the greatest possible capacitance-jump when the capacitors are switched in or out.

The dispersion which is used according to the invention as the dielectric material, and which is based on a polymeric resin, can be cured at comparatively low temperatures, in the range between approximately 150° and approximately 230° C., which represents an important advantage compared to the known cermet-type capacitors, which are produced with the aid of ceramic pastes or glass-frit pastes, and which require firing temperatures in the region of 1,000° C. These lower curing temperatures enable, in particular, the cheaper and less brittle substrate materials, which have previously been mentioned, to be used.

As the next step, there follows the production of the second, or upper capacitor electrodes, advantageously in combination with the production of a second conducting-path plane, in the form of input leads and connecting leads for these upper capacitor foils. In the illustrative embodiment described, this is carried out in a 2-step process shown in FIGS. 1d and 1e. In a preparatory step, according to FIG. 1d, a second dielectric layer 8 is initially printed, by screen-printing, onto the printed dielectric layer 6 (FIG. 1c), which had been applied previously, in accordance with the layout required for the regions 3, corresponding to the capacitors, and for the regions 9, corresponding to the conducting paths of an upper, second conducting-path plane (the conductors in this plane are shown, for the sake of simplicity, as coincident with the conducting-path regions 4 of the lower plane). The dielectric layer 8 can be of the same composition as the dielectric layer 6, or of a similar composition, but with the difference that it contains a palladium-based activator, which enables this second dielectric layer 8 to be metallized by a process which does not involve electric current. As a metallizing activator, or metallizing catalyst, elementary palladium can be present in the dielectric composition 8, preferably in amounts corresponding to a content of 0.1%. Alternatively, a palladium compound for example $PdCl_2$ can be used, but if a Pd compound of this type were to be used, it would be necessary to convert it into elementary Pd, after the baking-on of the layer, by a suitable method, for example by treatment in a chemical bath, in order to ensure the desired activation of the second dielectric layer 8 for the subsequent metallizing operation by a process which does not involve electric current.

Figure 1E:
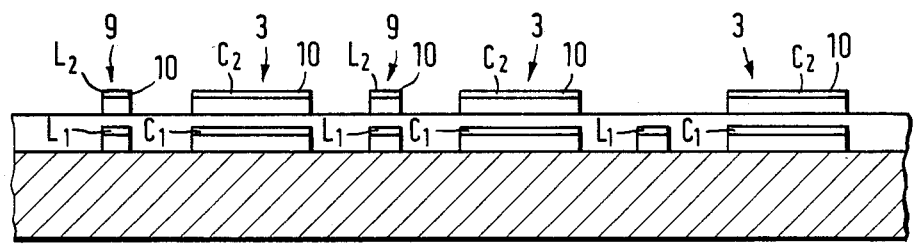

Following the curing of the second dielectric layer 8, containing the abovementioned activator, which again takes place at comparatively low temperatures, between approximately 150° and 230° C., this second dielectric layer 8 can now be metallized, as indicated in FIG. 1e, at 10, in a subsequent process step, in a metallizing bath which functions without electric current, without any further pretreatment (in the case where elementary Pd is initially incorporated as the activating catalyst), or after the abovementioned chemical reduction-pretreatment (in the case where a palladium compound is initially used as the activating component). By this means, the second or upper capacitor electrodes C2, are formed in the regions 3, corresponding to the capacitors, and the conducting paths L2 of the upper, or second, conducting-path plane are formed in the regions 9, corresponding to the conducting paths.

In a manner analogous to the production of the lower capacitor electrodes C1 and the conducting paths L1 of the lower conducting-path plane, according to FIGS. 1e and 1b, the production of the upper electrodes C2 and upper conducting paths L2 could also involve printing with dielectric compositions having dissimilar dielectric constants, in the regions 3, corresponding to the capacitors, on the one hand, and in the regions 9, corresponding to the conducting paths. According to a further alternative, the production of the capacitor electrodes C2 and the upper conducting paths L2 could, finally, also be carried out in a 1-step process, instead of the 2-step process according to FIGS. 1d and 1e, for the preferred metallization, which does not involve electric current, this 1-step process being carried out by printing-on an electrically conducting screen printing paste, for example a silver paste or a nickel paste. If this were done, however, the abovementioned problems resulting from the possible migration of silver, would once again occur, as would the disadvantage that the metal layers produced in this way, would not be solderable without difficulty.

With the status which is reached according to FIG. 1e, the production of the thick-film capacitors, and of the associated terminal leads and connecting leads is concluded, per se. The same screen printing paste, or a similar printing paste, having an identical, or dissimilar (lower), dielectric constant could be printed onto the open interspaces between the capacitor areas C2 and the conducting paths L2, as a result of which a virtually planar surface would be obtained, since the thickness of the metallized layers 10 lies within the order of magnitude below 10μ. An insulating lacquer could be applied, as an external protective and passivating coating, over the entire surface, leaving the connection points free.

It should be mentioned, furthermore, that through-contact areas can be made, in a manner known per se, through the insulating dielectric layers 8 and 6, between the conducting paths of the two planes L1 and L2, which paths can cross over, above each other, in any desired manner, these through-contact areas serving to establish conducting connections between the conducting paths. In addition, it is also possible to provide contact areas through the substrate 1, for example to establish conducting connections to an electronic system which is attached to the rear surface of the substrate 1. Through-contact areas of this type, irrespective of whether they are between the conducting paths L1 and L2, or whether they lead to the rear surface of the substrate plate 1, made simultaneously with capacitor electrodes and conducting paths.

The metal layers which are obtained by the metallizing process for producing the capacitor electrodes and/or the conducting paths, are completely solderable, and can be connected directly to chip components. The metal layers obtained by metallizing without electric current also possess the advantage of particularly good adhesion, due to the direct, intimate contact with the dielectric layers which carry them, this contact resulting from the nature of the process employed to produce these layers.

Figure 1F:
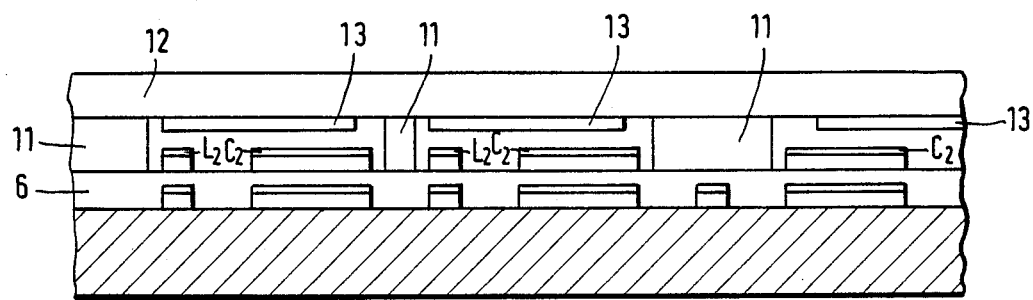

It is further intended, in the present illustrative embodiment, to describe, by reference to FIG. 1f, the special application and configuration of thick-film capacitors, according to the invention, as capacitive keyboards for input instruments of data-processing systems, which represents a preferred field of application of the capacitor circuits manufactured according to the invention, using printed circuit techniques. For this application, a comparatively large number of regions 3, corresponding to capacitors, are provided, these regions being arranged in the form of a matrix, in accordance with the key field which is conventional for input keyboards. For this special application, the filling of the interspaces between the capacitor foils C2 and the conducting paths L2 of the upper plane is omitted, and the respective input connection leads L2 to the capacitor electrodes C2 are not connected directly to these electrodes. Rather than direct connections, arrangements are provided to effect the switching-in and switching-out of the individual capacitors, by means of bridging contacts which can be operated by operating the keys, on the outside. According to FIG. 1f, spacers 11 are introduced, on the lower, first dielectric layer 6, at suitable points in the interspaces between the regions 3, corresponding to the capacitors, and the conducting paths L2 of the upper conducting-path plane, but not between a particular capacitor foil C2 and its associated connection lead L2. This arrangement can, preferably, involve a one-piece spacer-sheet 11, with appropriate cut-outs in the regions of the capacitors C2 and connecting leads L2 which are to be brought into contact. The spacer-sheet 11 can, for example, be a sheet of polyethylene, or a sheet of polyester. An outer sheet 12 is then placed over this spacer-sheet 11, this outer sheet covering the entire matrix arrangement, being supported by the spacer-sheet, and possessing, on its under surface, in the regions corresponding to the cut-outs in the spacer-foil 11, printed-on metallic bridging-contacts 13, composed, for example, of nickel, silver or, preferably, gold, these contacts being assigned to the capacitor electrodes C2 and connecting leads L2 in question. The contact-sheet 12 can likewise be composed of polyethylene or polyester, or even, for applications affected by particularly high temperatures, of polyimide. The thickness of the spacer-sheet 11 is chosen such that the bridging-contacts 13 are, in the normal rest condition, raised clear of the capacitor electrodes C2 and the associated connecting leads L2. By pressing the sheet 12 down, in the regions corresponding to the bridging-contacts 13 in question, the relevant capacitor C2 or C1, assigned to the region in question, is switched into the circuit, or, by releasing the key region, is switched out of the circuit again. This design of capacitive key fields possesses the advantage that the capacitance values assigned to the individual keys are permanently preset, and can only be switched-in by operating the keys in question, but are not generated by operating the keys. By this means, the capacitance tolerances can be kept small, since the individual capacitors, which are configured in the manner described, and which are implemented by printed-circuit technology, can be produced with a comparatively high accuracy, and the full switching-in or full switching-out of the individual capacitors serves as the switching criterion. By this means, a large capacitance-jump is obtained as a switching criterion, as a capacitor is switched in by means of actuating the contact key, especially in the case of the abovementioned preferred configuration of the regions located outside the regions corresponding to the capacitors, in which configuration the former regions are filled with dielectric pastes having a lower dielectric constant.

Figure 2:
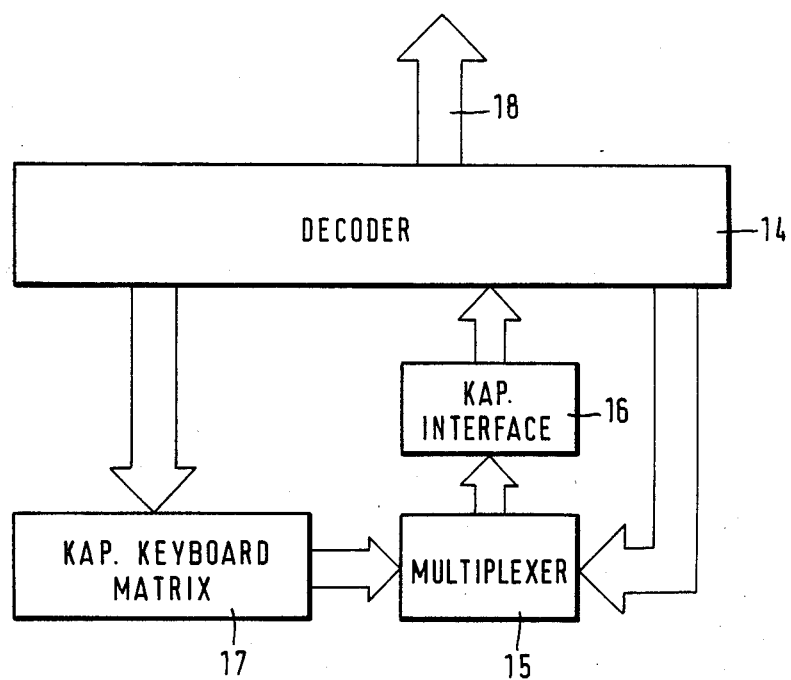
FIG. 2 shows a block diagram of a data-output terminal with a decoder circuit, this terminal employing a capacitive input keyboard, in order to illustrate a typical application environment.

FIG. 2 illustrates a typical application environment of a capacitive input keyboard of this type, this Figure being in the form of a block diagram of a data output terminal with a decoder circuit. The actual decoder circuit is marked 14, while 15 is a multiplexer circuit which is connected to the decoder circuit via a capacitive interface device 16. A capacitive keyboard matrix is indicated at 17', which can be designed in accordance with the embodiment of the invention described in the preceding text. The data output is indicated at 18, the data flow and interactions between the various parts of the overall installation being indicated by the arrows.

In the preceding text, the invention has been explained by reference to preferred embodiments, which can, of course, be modified in a multiplicity of ways, without thereby departing from the scope of the invention. The manufacture of the capacitors by thick-film techniques matched to printed-circuit technology, is essential to the basic concept of the invention, with the use of a screen-printable dielectric composition based on a polymeric resin which can be cured at comparatively low temperatures, preferably in combination with the production of the capacitor electrodes, and/or with the production of the conducting paths, by a metallization process which, while functioning without electric current, employs suitably activated dielectric layers.

We claim:

1. Thick film capacitor implemented by printed-circuit technology, comprising a substrate, a substantially planar base electrode positioned on said substrate, a thick-film dielectric which covers said base electrode and defines an upper surface which is substantially parallel to said base electrode, and a substantially planar counter-electrode positioned on said dielectric surface, in alignment with said base electrode, wherein said dielectric is composed of a screen-printable dispersion of dielectric filler substances in a polymeric material which can be cured at comparably low temperatures.

2. Capacitor according to claim 1, characterised in that the thick-film dielectric is composed from a dispersion containing 70 to 90% by weight of dielectric filler substances and 30 to 10% by weight of polymeric material.

3. Capacitor according to either of claims 1 or 2, characterised in that the thick-film dielectric contains, as dielectric filler substances, one or more substances from the group comprising ZnO, $Al_2O_3$, $SrTiO_3$, $BaTiO_3$, or ceramic substances.

4. Capacitor according to either of claims 1 or 2, characterised in that the thick-film dielectric contains, as polymeric material, one or more polymeric resins selected from the group comprising the polyurethane resins, the polyester resins, the epoxy resins, and the melamine formaldehyde resins.

5. A printed circuit comprising a substrate and a plurality of capacitors, wherein each of said capacitors comprises a base electrode on said substrate, a thick-film dielectric applied to said base electrode by screen printing, and a counter-electrode applied on said dielectric in alignment with said base electrode, wherein said dielectric is composed of a screen-printable dispersion of dielectric filler substances in a polymeric material curable at comparatively low temperatures, and a connecting lead connected to each of said capacitors, further characterised in that said printed circuit comprises regions situated outside the regions of said capacitors, said outside regions being composed of a dielectric constant lower than the dielectric constant of said capacitor dielectric.

6. Printed circuit according to claim 5, characterised in that the regions which are situated outside the capacitors are composed of a screen-printable dispersion of filler substances which have low dielectric constants, in an organic lacquer or resin.

7. Printed circuit according to claim 6, characterised in that the regions which are situated outside the regions associated with the capacitors contain one or more filler substances from the group consisting of $Al_2O_3$, MgO, therefor ceramic substances having low dielectric constants.

8. Printed circuit according to any one of claims 5 to 7, characterized in that it possesses conducting paths which, together with the terminal and connecting leads assigned to the capacitor electrodes, are in each case coplanar with the base electrodes and the counter-electrodes of the capacitors.

9. Printed circuit according to claim 5, characterised in that the lower capacitor electrode on the substrate and the upper electrode and the associated conducting paths consist of electrically conducting, screen printable pastes.

10. Printed circuit, according to claim 5, characterised in that the substrate is composed of resin-impregnated paper, glassfibre-reinforced plastic material, Ryton, polyester sheets, polyimide sheets, or thermosetting plastic material.

11. Printed circuit according to claim 5, characterised in that the capacitor base electrode or electrodes and the associated conducting paths are metallization layers deposited, by a process not involving electric current, onto screen-printed layers which comprise a catalyst activated for the metallization process.

12. A printed circuit containing one or more capacitors, and conducting paths assigned thereto, according to claim 11, characterised in that the capacitor counter-electrodes and the associated conducting paths are metallization layers deposited, by a process not involving electric current, onto a second dielectric layer, above the first thick-film dielectric, this second layer having been loaded with a catalyst and activated for the metallization process.

13. Printed circuit according to either of claims 11 or 12, characterised in that the screen-printable dielectric layers, which can be metallized by a process not involving electric current, contain an activating catalyst selected from the group comprising palladium and palladium compounds.

14. A printed circuit keying unit for input instruments of data-processing systems, comprising a plurality of capacitors, characterized in that said capacitors are arranged in the form of a matrix, and in that each said capacitor has a lower electrode and an upper electrode, a respective conducting path separated from, adjacent to and coplanar with each said upper electrode, and a bridging contact operable to connect each said conducting path with its respective adjacent said upper electrode.

15. Printed circuit according to claim 14, characterised in that spacers are provided in the interspace of the capacitor matrix arrangement, these spacers projecting above the plane in which the upper electrodes, or capacitor counter-electrodes and the associated conducting paths are located, such that the movable bridging contacts which interact with the upper electrodes are only in conductive contact with one another and with the associated terminal leads when a key is pressed.

16. Printed circuit according to claim 15, characterised in that a one-piece of sheet material is provided as a spacer, this piece of sheet material having cut-outs corresponding to the capacitors and to their associated terminal leads and in that the device for holding the bridging contacts is composed of a piece of flexible sheet material which is placed above the spacer-sheet and possesses, on its underside, printed-on metallized layers as bridging contacts, these layers being located within the cut-outs in the spacer-sheet and in association with the upper electrodes, or capacitor counter-electrodes and with the conducting paths assigned thereto.

* * * * *

UNITED STATES PATENT AND TRADEMARK OFFICE
CERTIFICATE OF CORRECTION

PATENT NO. : 4,555,745
DATED : November 26, 1985
INVENTOR(S) : Gisela Westermeir; Friedhard Fehr It is certified that error appears in the above-identified patent and that said Letters Patent is hereby corrected as shown below:

In Column 7, line 7: "1e" should be --1a--

In Column 10, line 12: "therefor" should be --and--

In Column 10, line 28: "glassfibre-reinforced" should be -- glass-fibre-reinforced --

Signed and Sealed this

First Day of April 1986

[SEAL]

Attest:

Attesting Officer

DONALD J. QUIGG

Commissioner of Patents and Trademarks